United States Patent [19]

McDonald

[11] Patent Number: 5,731,700
[45] Date of Patent: Mar. 24, 1998

[54] QUIESCENT POWER SUPPLY CURRENT TEST METHOD AND APPARATUS FOR INTEGRATED CIRCUITS

[75] Inventor: Charles McDonald, Mountain View, Calif.

[73] Assignee: LSI Logic Corporation, Milpitas, Calif.

[21] Appl. No.: 668,004

[22] Filed: Jun. 19, 1996

Related U.S. Application Data

[63] Continuation of Ser. No. 213,132, Mar. 14, 1994, abandoned.

[51] Int. Cl.$^6$ .................................................. G01R 31/26
[52] U.S. Cl. ........................................ 324/158.1; 324/765
[58] Field of Search ................................. 340/660–663; 324/99 D, 158.1, 765; 307/350; 371/25.1, 27

[56] References Cited

U.S. PATENT DOCUMENTS

| | | | |
|---|---|---|---|
| 2,710,397 | 6/1955 | Foster | 324/99 D |
| 3,904,892 | 9/1975 | Leonard | 307/350 |
| 4,316,185 | 2/1982 | Watrous et al. | 340/636 |
| 4,542,340 | 9/1985 | Chakravarti et al. | |
| 4,631,724 | 12/1986 | Shimizu | |
| 4,637,020 | 1/1987 | Schinabeck | |
| 4,661,930 | 4/1987 | Tran | |
| 4,710,704 | 12/1987 | Ando | |
| 4,727,318 | 2/1988 | Sakai et al. | |
| 4,743,842 | 5/1988 | Langone et al. | |
| 4,818,934 | 4/1989 | Tamamura | |
| 4,820,974 | 4/1989 | Katsura et al. | |
| 4,985,672 | 1/1991 | Hashimoto et al. | |
| 5,025,344 | 6/1991 | Maly et al. | |
| 5,057,774 | 10/1991 | Verhelst et al. | |
| 5,059,889 | 10/1991 | Heaton | |
| 5,097,206 | 3/1992 | Perner | |
| 5,132,615 | 7/1992 | Person | |
| 5,202,625 | 4/1993 | Farwell | |
| 5,272,393 | 12/1993 | Horiguchi et al. | 307/350 |

*Primary Examiner*—Vinh P. Nguyen
*Assistant Examiner*—Russell M. Kobert
*Attorney, Agent, or Firm*—Oppenheimer Poms Smith

[57] ABSTRACT

An active load is connected to a power supply terminal of an electronic device such as an integrated circuit. The active load receives a reference voltage that is equal to a normal power supply voltage for application to the terminal, and a source current that is equal to a maximum quiescent power supply current that the device should sink through the terminal. A vector generator applies test signals to the device that cause it to switch between respective operating states. During each operating state, a voltage source that generates the normal power supply voltage is connected to the terminal for a length of time sufficient for the device to attain the respective operating state, and is then removed such that the device is powered only by the active load. After a sufficient length of time has elapsed for the device to achieve a quiescent state, the voltage at the terminal is sensed. If the current flowing from the active load into the terminal is less than the maximum quiescent power supply current, the sensed voltage will be equal to the reference voltage. If the current is greater than the maximum quiescent power supply current, indicating a device defect in the respective operating state, the sensed voltage will be lower than the reference voltage.

22 Claims, 3 Drawing Sheets

QUIESCENT POWER SUPPLY CURRENT TEST METHOD AND APPARATUS FOR INTEGRATED CIRCUITS

This application is a continuation of U.S. patent application Ser. No. 08/213,132, filed Mar. 14, 1994, now abandoned.

BACKGROUND OF THE INVENTION

1. Field of the Invention

The present invention generally relates to the testing of electronic devices, and more specifically to a quiescent power supply current test method and apparatus for integrated circuits.

2. Description of the Related Art

Numerous procedures have been developed for the testing of electronic devices such as Complementary Metal Oxide Semiconductor (CMOS) integrated circuits. Such devices have many operational states that depend on which unit cells are being accessed and the particular logical operations that are being performed.

For example, a CMOS memory includes a large number of Field Effect Transistors (FET) that are arranged to constitute unit storage locations or cells. Semiconductor fabrication processes are vulnerable to many conditions that can result in the generation of defects, some of which affect only certain cells. For this reason, it is necessary to perform tests on integrated circuit devices which are sufficiently comprehensive that local defects can be detected, and the defective devices rejected.

A basic type of testing is known as functional testing, in which test patterns, also known as vectors, are applied to inputs of the devices, and the patterns that appear at the outputs of the devices are sensed. Since the output patterns that correspond to specific input vectors for normal devices are known in advance, any deviation from the expected outputs indicates a device defect. For example, a particular test pattern can be stored in a memory device, and then read out cell by cell and compared with the original pattern.

Certain types of defects, such as local partial shorts and open circuits, may not be detected using functional testing. Another type of testing that is effective for detecting such defects is quiescent power supply current sensing, an example of which is disclosed in U.S. Pat. No. 5,057,774, entitled "APPARATUS FOR MEASURING THE QUIESCENT CURRENT OF AN INTEGRATED MONOLITHIC DIGITAL CIRCUIT", issued Oct. 15, 1991 to Sebastiaan Verhelst et al. In this type of testing, a defective device is indicated by an abnormally large value of quiescent current in one or more operational states.

A conventional test apparatus 10 for measuring quiescent power supply current, which is designated as quiescent drain current IDDQ for an FET based device, is illustrated in FIG. 1. A current sensor 12 is connected in series between a power supply terminal 14 of an electronic device to be tested, commonly referred to in the art as a Device Under Test (DUT) 16, and a drain supply voltage VDD. The other power supply terminal of the device 16 is grounded or, although not illustrated, connected to a source supply voltage.

A control unit 18 comprises a vector generator 20 that generates test patterns or vectors and applies them to inputs of the DUT 16. The vectors correspond to operational states of the DUT 16. For example, if the DUT 16 is a memory device, the vectors can sequentially access the memory locations of the DUT 16.

The output of the current sensor 12 is connected to a sensing input of a computer 22, which also controls the vector generator 20. The results of the test can be displayed on a display unit 24, and/or can be applied to automatically reject the DUT 16 from an automated assembly line (not shown) if the DUT 16 fails the test.

The operation of the apparatus 10 is illustrated in FIG. 2. The vector generator 20 applies a vector signal VECTOR, which typically comprises a plurality of parallel inputs, to the DUT 16. Three consecutive vectors, designated as VECTOR1, VECTOR2 and VECTOR3 are illustrated in the drawing, and are applied at times T1, T3 and T5 respectively.

The current sensed by the sensor 12 is designated as ISENSE, and is compared with a reference current value IREF. IREF is a maximum allowable or pass/fail value of quiescent power supply current. If ISENSE is lower than IREF, the DUT 16 is normal, whereas if ISENSE is higher than IREF, the DUT 16 is determined to be defective and is rejected.

As each vector VECTOR1 TO VECTOR 3 is applied to the DUT 16, the sensed current ISENSE rises to an initially high transient value, and eventually settles down to a quiescent value. After a predetermined length of time TS has elapsed after the signal VECTOR has been switched to a new value, which is sufficient for ISENSE to attain a quiescent value in each operating state, a strobe pulse STROBE is applied from the computer 22 to the current sensor 12 that causes the instantaneous value of ISENSE to be latched and applied to the computer 22.

As illustrated, the STROBE pulses are applied at times T2, T4 and T6 respectively, such that T2−T1=T4−T3=T6−T5=TS. In the illustrated example, the operational state corresponding to VECTOR1 is normal, the state corresponding to VECTOR2 is abnormal or defective and the state corresponding to VECTOR3 is normal.

More specifically, the quiescent power supply current IDDQ is sensed at the time T2 in response to a STROBE pulse. A sufficient length of time (TS) has elapsed since the signal VECTOR was switched to the pattern VECTOR1 for the sensed power supply current ISENSE to attain a quiescent value. The sensed current ISENSE is lower than the reference value IREF. This indicates that the operational state of the DUT 16 corresponding to the input signal or vector pattern VECTOR1 is normal.

The operational state corresponding to VECTOR2 is sensed at the time T4, and the sensed current ISENSE is higher than the reference value IREF. This indicates that the quiescent power supply current IDDQ, as represented by the current sensed value ISENSE, is above the predetermined maximum limit value. The DUT 16 can, as illustrated, also produce a normal value for the operational state corresponding to VECTOR3, as well as other input test or vector patterns (not shown).

The DUT 16 will be judged as defective since it failed the test in response to VECTOR2, even though the test for the operational states corresponding to VECTOR1 and VECTOR2 were normal.

Although capable of performing its intended function of measuring quiescent power supply current, the prior art apparatus 10 is disadvantageous in that it is slow in operation. This is because the apparatus 10 measures the quiescent current IDDQ as a D.C. current value using an essentially static test method. D.C. current measurements require 1 to 5 milliseconds to perform using currently available technology.

The time required for internal capacitances in the power supply and the device under test to charge and enable the current to stabilize at a quiescent value is also large. This is because stray capacitances must be charged or discharged in order to change the voltages at circuit nodes. This further limits the speed at which the testing can be performed.

The length of time that would be required for testing a large number, for example hundreds of thousands of vectors per device, would be excessive for practical commercial production. For this reason, the prior art apparatus 10 is limited to applications in which only relatively small numbers of vectors need to be tested.

SUMMARY OF THE INVENTION

It is an object of the present invention to provide a quiescent power source current testing method and apparatus for integrated circuit and other electronic devices that operates at high speed compared to the prior art, and which is therefore applicable for testing integrated circuits in which a large number of vectors must be tested.

This object is achieved in a quiescent power source current testing apparatus embodying the present invention comprising an active load which is connected to a power supply terminal of an electronic device such as an integrated circuit. The active load receives a reference voltage that is equal to a normal power supply voltage for application to the terminal, and a source current that is equal to a maximum quiescent power supply current that the device should sink through the terminal.

A vector generator applies test signals to the device that cause it to switch between respective operating states. During each operating state, a voltage source that generates the normal power supply voltage is connected to the terminal for a length of time sufficient for the device to attain the respective operating state, and is then removed such that the device is powered only by the active load.

After a sufficient length of time has elapsed for the device to achieve a quiescent state, the voltage at the terminal is sensed. If the current flowing from the active load into the terminal is less than the maximum quiescent power supply current, the sensed voltage will be equal to the reference voltage. If the current is greater than the maximum quiescent power supply current, indicating a device defect in the respective operating state, the sensed voltage will be lower than the reference voltage.

A method for sensing current flow through a power supply terminal of an electronic device in accordance with the present invention comprises connecting an active load to the terminal such that a voltage at the terminal has a first predetermined value if the current is less than a second predetermined value, and such that the voltage is lower than said first predetermined value if the current is greater than said second predetermined value, and sensing the voltage.

The present method and apparatus achieve the objects of the invention by replacing the time consuming D.C. current measurement of the prior art with a comparison function. The quiescent power supply current IDDQ is not measured per se, but converted into a voltage that is compared with a reference value.

In addition, the present invention substantially reduces the time required to charge internal capacitances in the power source and the device under test by connecting the device terminal to the power source for only a short length of time which is sufficient for the device to attain an operating state in response to an applied test vector, and then powering the device using only the active load. Powering the device using an active current load reduces the requirement that stray capacitances be charged or discharged in order to change the voltages at circuit nodes.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
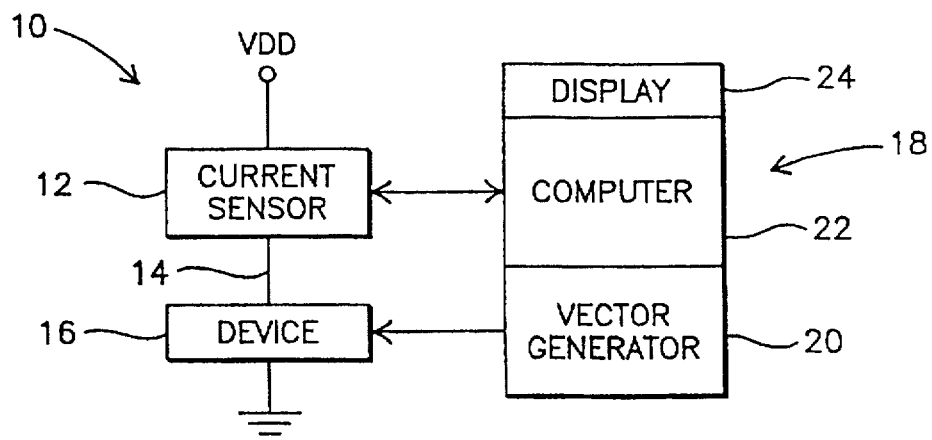
FIG. 1 is a block diagram illustrating a conventional quiescent power supply current test apparatus.
Figure 2:
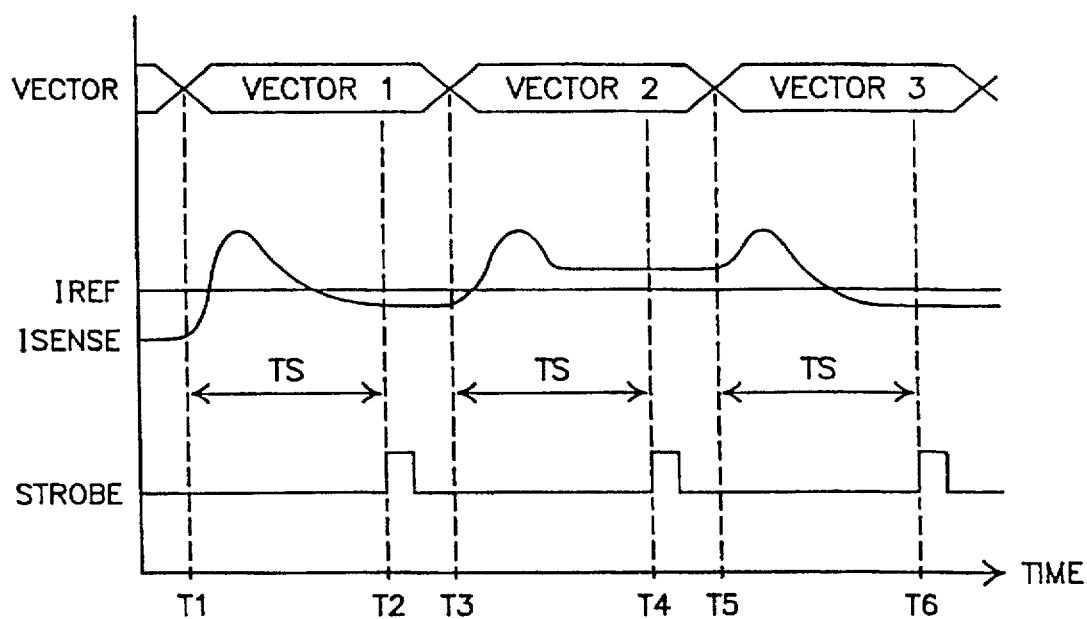
FIG. 2 is a timing diagram illustrating the operation of the apparatus of FIG. 1.
Figure 3:
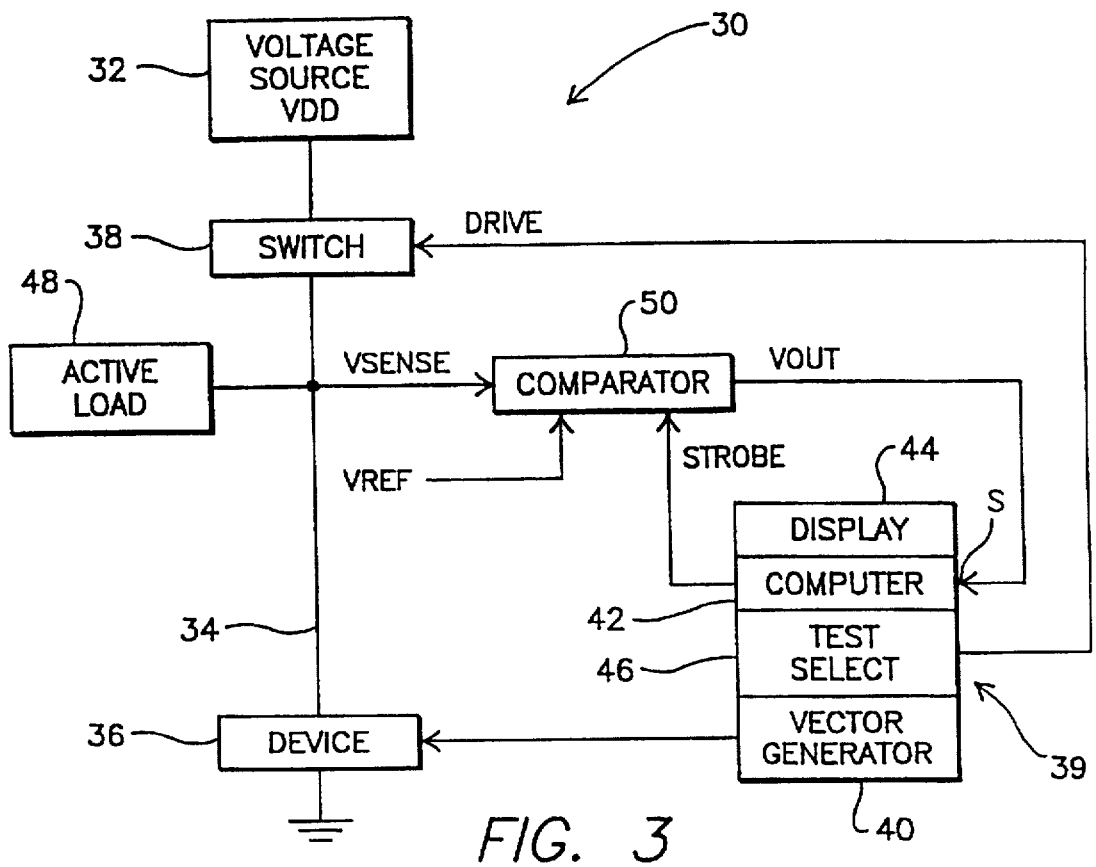
FIG. 3 is a block diagram illustrating a quiescent power supply current test apparatus embodying the present invention.

A test apparatus embodying the present invention for measuring quiescent power supply current, which is designated as quiescent drain current IDDQ for an FET based device, is illustrated in FIG. 3 and generally designated by the reference numeral 30.

The apparatus 30 comprises a voltage source 32 for applying a power supply voltage to a power supply terminal 34 of a Device Under Test (DUT) 36. For an FET based DUT 36, the voltage applied by the source 32 is designated as drain voltage VDD, although the invention is not limited to FET devices. The other power supply terminal of the device 36 is to ground or, although not specifically illustrated, to a source supply voltage.

A first switch 38, which is preferably embodied by an FET switching transistor as will be described in detail below, is connected between the source 32 and the DUT 36. A control unit 39 comprises a vector generator 40 that generates test patterns or vectors and applies them to inputs of the DUT 36. The vectors correspond to operational states of the DUT 36. For example, if the DUT 36 is a memory device, the vectors can sequentially access the memory locations of the DUT 36.

The terminal 34 of the DUT 36 is connected to a sensing input(s) of a computer 42, which also controls the vector generator 40. The results of the test can be displayed on a display unit 44, and/or can be applied to automatically reject the DUT 36 from an automated assembly line (not shown) if the DUT 36 fails the test. The control unit 39 further comprises a test select unit 46 that enables tests other than quiescent power supply current testing, such as functional testing, to be performed on the DUT 36.

In accordance with the present invention, an active load 48 is connected to the terminal 34 of the DUT 36. A comparator 50 has an input connected to the terminal 34 for sensing a voltage VSENSE. The comparator 50 has another input connected to receive a reference voltage VREF. The output of the comparator 50 is designated as VOUT, and is applied to the computer 42, which applies strobe pulses STROBE to an enable input of the comparator 50.

Figure 4:
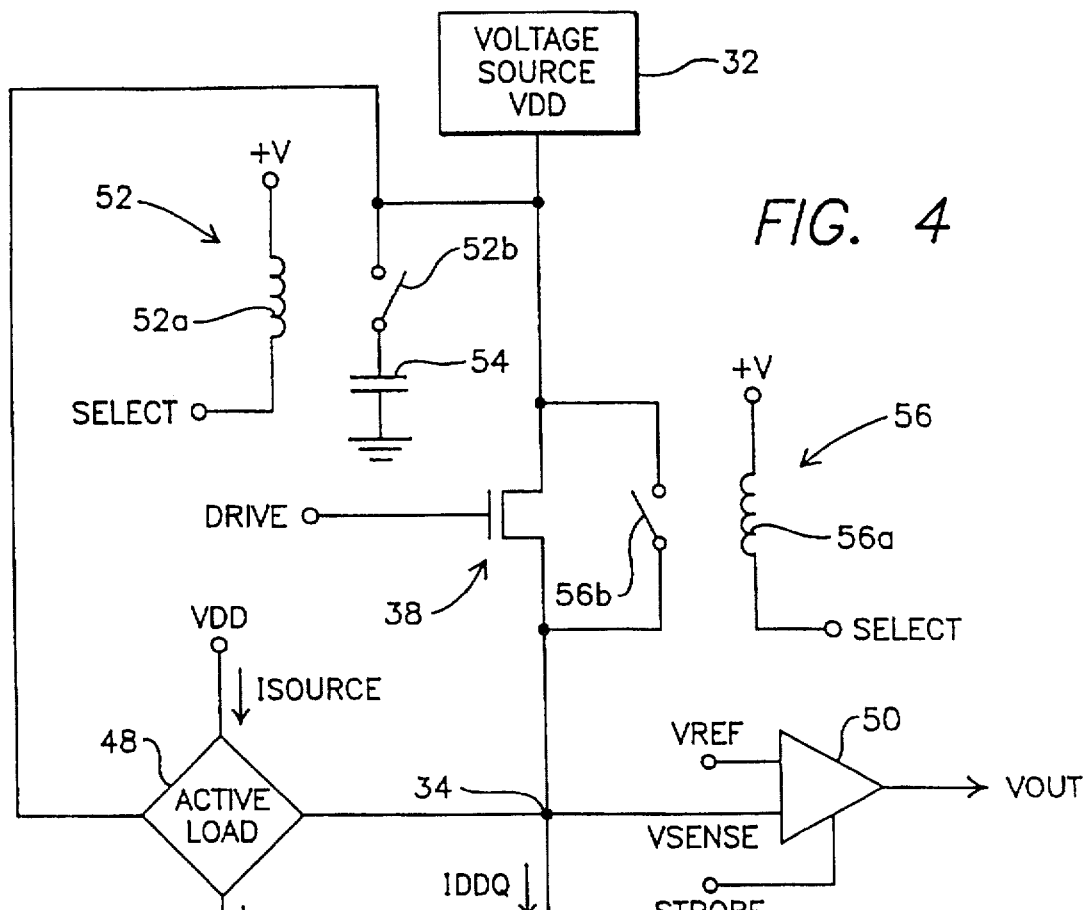
FIG. 4 is a more detailed circuit diagram of the apparatus of FIG. 3.

With reference also being made to FIG. 4, a relay 52 is provided for selectively connecting a decoupling capacitor 54 across the DUT 36. The capacitor 54 is required for functional testing, which is not the particular subject matter of the present invention and will not be described in detail. The capacitor 54 is connected in series with contacts 52b of the relay 52 between the voltage source 32 and ground.

The contacts 52b are normally open. When a SELECT signal, which is generated by the computer 42 when functional testing of the DUT 36 is required, is applied to a coil 52a of the relay 52, the contacts 52b close to connect the decoupling capacitor 54 across the DUT 36.

Further illustrated is a relay 56 including a coil 56a and contacts 56b. The relay 56 is provided to short out the switch 38, which is illustrated as being constituted by a switching FET, and connect the power source 32 directly to the terminal 34 of the DUT 36 for functional testing. The contacts 56b are connected across the drain and source of the FET switch 38 and are normally open. Upon application of the SELECT signal, the contacts 56b close to short out the switch 38. The gate of the FET switch 38 is connected to receive a DRIVE signal from the computer 42.

Figure 5:
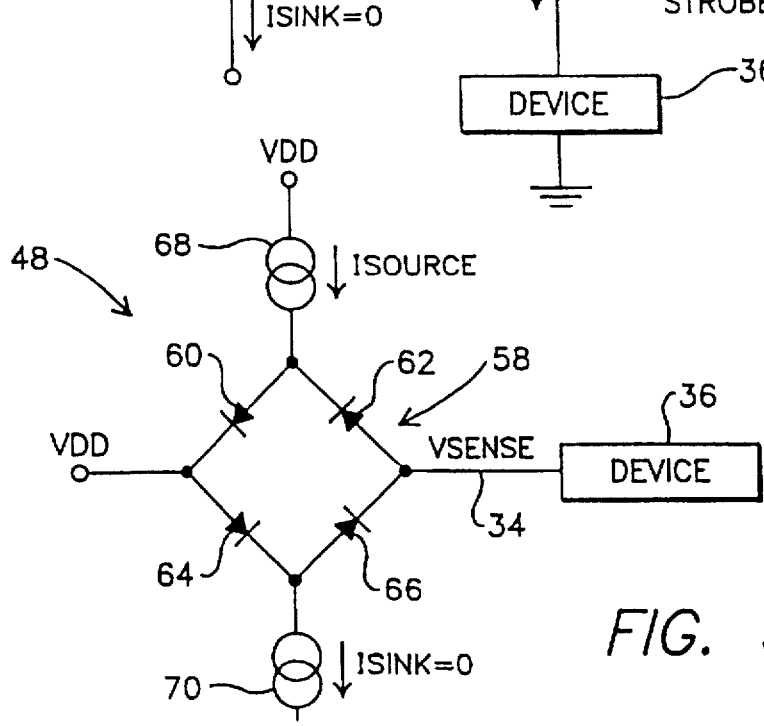
FIG. 5 is an electrical schematic diagram illustrating an active load of the present apparatus.

As illustrated in detail in FIG. 5, the active load 48 comprises a diode bridge 58 including four diodes 60, 62, 64 and 66. A constant current source that supplies a current ISOURCE is connected between the power source 32 and the junction of the diodes 60 and 62. The active load 48 has a reference voltage input constituted by the junction of the diodes 60 and 64 that is connected to the voltage source to receive the voltage VDD.

A constant current sink 70 which sinks a current ISINK is connected to a sink current input of the active load that is constituted by the junction of the diodes 64 and 66. The sink 70 is unconnected, such that ISINK=0. The junction of the diodes 62 and 66, which constitutes the output of the active load 48, is connected to the terminal 34 of the DUT 36.

Figure 6:
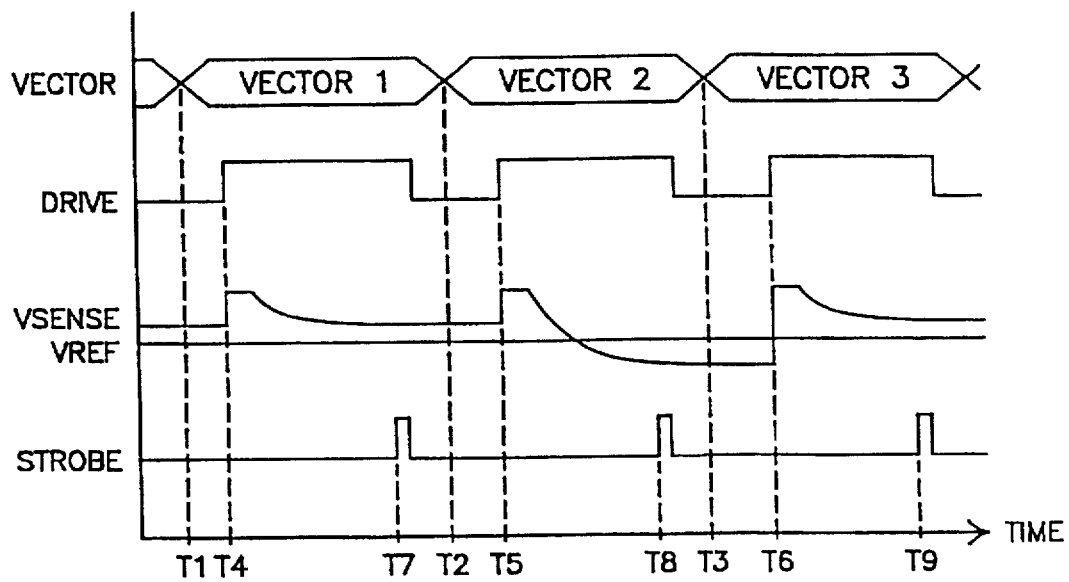
FIG. 6 is a timing diagram illustrating the operation of the present apparatus.

The operation of the present test apparatus 30 is illustrated in FIG. 6. The switch 38 is turned on to connect the voltage source 32 to the device terminal 34 When the DRIVE signal is logically low, and turned off when the DRIVE signal is logically high. In response to a STROBE pulse, the comparator 50 is latched to produce an output signal VOUT in accordance with the amplitude of the signal VSENSE.

The present apparatus 10 is capable of sensing the quiescent power supply current IDDQ in response to each test vector within a test period of 100 microseconds. This is much faster than the prior art test period of 1 to 5 milliseconds. Assuming a test period of 100 microseconds, the VECTOR signal is switched to VECTOR1, VECTOR2 and VECTOR3 at times T1, T2 and T3 respectively such that T2−T1=T3−T2=100 microseconds.

The DRIVE signal is low at the beginning of each test interval to turn on the switch 38 and connect the power source 32 to the terminal 34 of the DUT 36. This supplies sufficient power to ensure that the DUT 36 will attain the respective operational state in response to each applied test vector. The DRIVE signal is made high 20 microseconds after the beginning of each test interval at times T4, T5 and T6 respectively, such that T4−T1=T5−T2=T6−T3=20 microseconds. In this condition, the DUT 36 is powered only by the active load 48.

The STROBE pulses are applied at times T7, T8 and T9, which are preferably 89 microseconds after the times T1, T2 and T3 respectively, such that T7−T1=T8−T2=T9−T3=89 microseconds. The time periods during which the DUT 36 is powered only by the active load 48, more specifically T7−T4=T8−T5=T9−T6=69 microseconds, is selected to be sufficient that the DUT 36 will attain a stable value of quiescent current flowing through the terminal 34 in each operational state. The DRIVE signal is made low shortly after each STROBE pulse, preferably 80 microseconds after each of T1, T2 and T3 respectively.

The active load 48 operates such that, if the quiescent power supply current IDDQ is less than a predetermined maximum acceptable value, in the illustrated example ISOURCE, the voltage at the terminal 34 will be VDD. In this case, VSENSE=VDD is higher than VREF, and the comparator 50 will produce a high output in response to a STROBE pulse. However, if IDDQ is higher than ISOURCE, VSENSE will be lower than VDD.

The active load 48 is configured such that the voltage at the terminal 34 progressively decreases as IDDQ increases. If IDDQ is only slightly above ISOURCE, the voltage VSENSE at the terminal 34 will be between VDD and VREF and the comparator 50 will still produce a high output. This enables a margin of acceptable tolerance.

However, if IDDQ exceeds ISOURCE to such an extent that VSENSE is lower than VREF, the comparator 50 will produce a low output indicating that the DUT 36 is defective in the operating state being tested. In FIG. 6, VSENSE is higher than VREF for VECTOR1, lower than VREF for VECTOR2 and higher than VREF for VECTOR3, indicating normal, defective and normal operating states respectively.

In a preferred example, VDD=5 volts, and VREF is 50 millivolts lower than VDD, such that VREF=4.095 volts= 0.99 ×VDD. The maximum allowable value of IDDQ is 20 microamperes. Thus, ISOURCE is set to 20 microamperes.

Referring again to FIG. 5, since VDD=5 volts, if the DUT 36 is sinking less than 20 microamperes through the terminal 34, the bridge 58 will be balanced. More specifically, the voltage at the junction of the diodes 60 and 62 will be 5.6 volts (one diode drop =0.6 volts above that at the junction of the diodes 60 and 64), and the voltage at the junction of the diodes 62 and 66 will be 5 volts (one diode drop below the voltage at the junction of the diodes 60 and 62).

If the DUT 36 sinks more than 20 microamperes, the bridge 58 will be unbalanced since the current source 68 is only capable of sourcing 20 microamperes. Thus, the voltage VSENSE will progressively drop below 5 volts as the current sunk by the DUT 36 increases above 20 microamperes.

The present invention is especially advantageous in that the timing is constant for all maximum values of IDDQ. It is merely required to program the current source 68 for the maximum value of IDDQ for the particular type of DUT 36 being tested.

The output of the comparator 50 is connected to a sensing input of a computer 42. The results of the test can be displayed on the display unit 44, and/or can be applied to automatically reject the DUT 36 from an automated assembly line (not shown) if the DUT 36 fails the test.

The present IDDQ test method can be combined with other test methods as indicated above. Preferably, functional testing is performed first, with the SWITCH signal made high to connect the decoupling capacitor 54 and short out the switch 38 as described above and, if the DUT 36 passes the functional testing, the SWITCH signal is made low and the DUT 36 is subjected to the present IDDQ testing.

The present method and apparatus achieve the objects of the invention by replacing the time consuming D.C. current measurement of the prior art with a comparison function. The quiescent power supply current IDDQ is not measured per se, but converted into a voltage that is compared with a reference value.

In addition, the present invention substantially reduces the time required to charge internal capacitances in the power source and the device under test by connecting the device terminal to the power source for only a short length of time which is sufficient for the device to attain an operating state in response to an applied test vector, and then powering the device using only the active load.

Powering the device using an active current load reduces the requirement that stray capacitances be charged or discharged in order to change the voltages at circuit nodes.

While an illustrative embodiment of the invention has been shown and described, numerous variations and alternate embodiments will occur to those skilled in the art, without departing from the spirit and scope of the invention.

For example, although the present invention has been described and illustrated as being applied to IDDQ testing of FET based devices, it is not so limited, and can be applied to testing other types of electronic devices such as bipolar transistor based circuits.

Accordingly, it is intended that the present invention not be limited solely to the specifically described illustrative embodiment. Various modifications are contemplated and can be made without departing from the spirit and scope of the invention as defined by the appended claims.

I claim:

1. A system for sensing current flow through a power supply terminal of an electronic device, comprising:

a first energy source for supplying the electronic device power terminal with electrical energy for an energization time period of $t_1$ microseconds, where $t_1$ microseconds is a sufficient period of time to enable the device to attain an operational state for vector testing purposes;

a second energy source for supplying the electronic device power terminal with electrical energy for another energization time period of $t_2$ microseconds, where $t_2$ microseconds is a sufficient period of time to enable the electronic device to attain a stable value of quiescent current flow in each of its operational states;

time sensing means for monitoring the stable value of the quiescent current flow attained by the electronic device for a testing period of $t_3$ microseconds, where $t_3$ microseconds is a substantially shorter period of time than either $t_1$ microseconds or $t_2$ microseconds;

a vector generator for applying at least one test vector to the electronic device while said time sensing means is monitoring the stable value of the quiescent current flow attained by the electronic device;

a comparator coupled to the power terminal of the electronic device for determining whether the voltage at the terminal is above a reference voltage level;

error generating means responsive to said comparator for causing an error signal to be generated when the voltage at the terminal is less than said reference voltage level; and wherein said second energy source is an active load for causing current to flow between the active load and the electronic device such that the voltage at said terminal has a first predetermined value if said current is less than a second predetermined value, and such that the voltage at the terminal is lower than said first predetermined value if said current is greater than said second predetermined value.

2. A system according to claim 1, in which:

said voltage decreases progressively as said current includes above said second predetermined value;

the voltage sensor produces a first output signal if said voltage is higher than a third predetermined value that is lower than said first predetermined value, and produces a second output signal if said voltage is lower than said third predetermined value.

3. A system according to claim 2, in which said third predetermined value is approximately 0.99 times said first predetermined value.

4. A system according to claim 2, in which the voltage sensor comprises a comparator having a first input connected to said terminal and a second input connected to receive a reference voltage having said third predetermined value.

5. A system according to claim 1, in which:

said device has a plurality of operational states; and the apparatus further comprises a controller for controlling said device to sequentially operate in said plurality of operational states.

6. A system according to claim 5, in which the voltage sensor senses said voltage in each of said operational states after said device has reached a quiescent condition.

7. A system according to claim 5, in which the controller comprises a test vector generator.

8. A system according to claim 1, further comprising:

a voltage source for producing a power supply voltage having substantially said first predetermined value;

a first switch for connecting the voltage source to said terminal for a predetermined length of time and then disconnecting the voltage source from said terminal in each of said operational states, said predetermined length of time being sufficient to cause said device to attain said operational states; and a second switch for controlling the voltage source from said terminal and said device has achieved a quiescent condition.

9. A system according to claim 8, in which the first switch comprises a filed-effect transistor connected between the voltage source and said terminal.

10. A system according to claim 8, in which the second switch comprises a comparator having a strobe input.

11. A system for testing the quiescent power supply current IDDQ of an electronic device having a power input terminal, comprising:

a first energy source for supplying the electronic device power terminal with electrical energy for an energization time period of $t_1$ microseconds, where $t_1$ microseconds is a sufficient period of time to enable the device to attain an operational state for vector testing purposes;

a second energy source for supplying the electronic device power terminal with electrical energy for another energization time period of $t_2$ microseconds, where $t_2$ microseconds is a sufficient period of time to enable the electronic device to attain a stable value of quiescent current flow in each of its operational states;

time sensing means for monitoring the stable value of the quiescent current flow attained by the electronic device for a testing period of $t_3$ microseconds, where $t_3$ microseconds is a substantially shorter period of time than either $t_1$ microseconds or $t_2$ microseconds;

a vector generator for applying at least one test vector to the electronic device while said time sensing means is monitoring the stable value of the quiescent current flow attained by the electronic device;

a comparator coupled to the power terminal of the electronic device for determining whether the voltage at the terminal is above a reference voltage level; and error generating means responsive to comparator for causing an error signal to be generated when the voltage at the terminal is less than said reference voltage level.

12. A system according to claim 11, wherein said active load means includes:

an active load connectable to the terminal of the electronic device, said active load for causing current to flow between said active load and the terminal of the electronic device; and wherein said error generating means includes:

a comparator having an input connectable to the terminal of the electronic device, said comparator for producing an output signal indicative of the voltage at the terminal of the electronic device;

said active load for causing current to flow to the terminal of the electronic device such that the voltage at the terminal has a first predetermined value when said current is less than a second predetermined value, said comparator producing a first output signal in response thereto indicating that the electronic device is functional, and such that the voltage at the terminal is less than said first predetermined value when said current is greater than said second predetermined value, said comparator producing a second output signal in response thereto indicating that the electronic device is defective.

13. A system according to claim 12, wherein the electronic device has a plurality of operational states and wherein said error generating means includes:

a controller for controlling the electronic device to operate sequentially in the plurality of operational states;

said comparator producing said output signal indicative of the voltage at the terminal of the electronic device for each of the plurality of operational states when the electronic device has reached a quiescent condition.

14. A system according to claim 13, wherein said means for supplying the electronic device with electrical energy from said first energy source includes:

a voltage source for providing a power supply voltage substantially equal to said first predetermined value;

a first switch for connecting said voltage source to the terminal of the electronic device for a predetermined length of time substantially equal to $t_1$ microseconds and then disconnecting said voltage source from the terminal of the electronic device in each of the plurality of operational states of the electronic device, said predetermined length of time being sufficient to cause the electronic device to attain each of the plurality of operational states; and a second switch for controlling said comparator to sense said voltage in each of the plurality of operational states when said first switch has disconnected said voltage source from the power supply terminal and the electronic device has reached a quiescent condition.

15. A method for testing the quiescent power supply current IDDQ of an electronic device, comprising:

supplying the electronic device with electrical energy from a first energy source for an energization time period of $t_1$ microseconds, where $t_1$ microseconds is a sufficient period of time to enable the device to attain an operational state for vector testing purposes;

supplying the electronic device with electrical energy from a second energy source for another energization time period of $t_2$ microseconds, where $t_2$ microseconds is a sufficient period of time to enable the electronic device to attain a stable value of quiescent current flow in each of its operational states;

monitoring the stable value of the quiescent current flow attained by the electronic device for a testing period of $t_3$ microseconds where $t_3$ microseconds is a substantially shorter period of time than either $t_1$ microseconds or $t_2$ microseconds;

applying at least one test vector to the electronic device while monitoring the stable value of the quiescent current flow attained by the electronic device;

determining whether the voltage at the terminal is above a reference voltage level; and causing an error signal to be generated when the voltage at the terminal is less than said reference voltage level.

16. A method according to claim 15, wherein said step of supplying the electronic device with electrical energy from a second energy source includes:

(a) connecting an active load to the terminal for causing current to flow between said active load and the electronic device such that the voltage at said terminal has a first predetermined value if said current is less than a second predetermined value, and such that the voltage at said terminal is lower than said first predetermined value if said current is greater than said second predetermined value; and wherein said step of determining the voltages includes:

(b) sensing the voltage at the terminal.

17. A method as in claim 16, in which:

said voltage decreases progressively as said current increases above said second predetermined value; and step (b) comprises comparing said voltage with a third predetermined value that is lower than said first predetermined value.

18. A method as in claim 17, in which said third predetermined value is approximately 0.999 times said first predetermined value.

19. A method as in claim 16, in which:

said device has a plurality of operational states; and the method further comprises the step of:

(c) controlling said device to sequentially operate in said plurality of operational states.

20. A method as in claim 19, in which step (b) comprises sensing said voltage in each of said operational states after said device has reached a quiescent condition.

21. A method as in claim 20, in which step (b) further comprises the substeps of:

(d) connecting a voltage source that produces a power supply voltage having substantially said first predetermined value to said terminal for a predetermined length of time and then disconnecting the voltage source from said terminal in each of said operational states, said predetermined length of time being sufficient to cause said device to attain said operational states; and (e) sensing said voltage in each of said operational states after the voltage source has been disconnected from said terminal and said device has achieved a quiescent condition.

22. A method as in claim 19, in which step (c) comprises sequentially applying a plurality of test vectors corresponding to said plurality of operational states respectively to said device.

* * * * *